United States Patent
Chen et al.

(10) Patent No.: US 7,816,256 B2
(45) Date of Patent: Oct. 19, 2010

(54) PROCESS FOR IMPROVING THE RELIABILITY OF INTERCONNECT STRUCTURES AND RESULTING STRUCTURE

(75) Inventors: Hsien-Wei Chen, Sinying (TW); Jian-Hong Lin, Yunlin (TW); Tzu-Li Lee, Yunlin (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1020 days.

(21) Appl. No.: 11/487,741

(22) Filed: Jul. 17, 2006

(65) Prior Publication Data

US 2008/0014741 A1    Jan. 17, 2008

(51) Int. Cl.
*H01L 21/4763* (2006.01)
(52) U.S. Cl. ...................................... 438/637
(58) Field of Classification Search ................... 438/637
See application file for complete search history.

(56) References Cited

U.S. PATENT DOCUMENTS

| 6,319,809 | B1 | 11/2001 | Chang et al. |
| 6,436,850 | B1 * | 8/2002 | Morales ...................... 438/781 |
| 6,794,295 | B1 | 9/2004 | Lin et al. |
| 6,812,043 | B2 | 11/2004 | Bao et al. |
| 6,825,561 | B1 | 11/2004 | Agarwala et al. |
| 6,919,638 | B2 | 7/2005 | Huang et al. |
| 6,924,242 | B2 | 8/2005 | Jang et al. |
| 6,955,984 | B2 | 10/2005 | Wan et al. |
| 6,958,524 | B2 | 10/2005 | Li et al. |
| 2002/0074659 | A1 | 6/2002 | Dalton et al. |
| 2006/0160352 | A1 * | 7/2006 | Matsushita et al. .......... 438/622 |

FOREIGN PATENT DOCUMENTS

CN    1427456 A    7/2003

OTHER PUBLICATIONS

Cheng, Y.L. "Moisture resistance and thermal stability of fluorine-incorporation siloxane-based low dielectric constant material" Thing Solid Films 447-448 2004 pp. 681-687.*
Kim, Taek-Soo "Depth dependence of ultraviolet curing of organosilicate low-k thin films" Journal of Applied Physics 103 2008 pp. 064108-1-064108-8.*

(Continued)

*Primary Examiner*—N Drew Richards
*Assistant Examiner*—Grant S Withers
(74) *Attorney, Agent, or Firm*—Slater & Matsil, L.L.P.

(57) ABSTRACT

An interconnect structure of an integrated circuit having improved reliability and a method for forming the same are provided. The method includes providing a substrate, forming a dielectric layer overlying the substrate, performing a first shrinking process, wherein the dielectric layer shrinks and has a first shrinkage rate, forming a conductive feature in the dielectric layer after the step of performing the first shrinking process, and performing a second shrinking process after the step of forming the conductive feature, wherein the dielectric layer substantially shrinks and has a second shrinkage rate.

8 Claims, 5 Drawing Sheets

OTHER PUBLICATIONS

Kim, Taek-Soo "Tuning depth profiles of organosilicate films with ultraviolet curing" Journal of Applied Physics 104 2008 pp. 074113-1-074113-6.*

Smith, Ryan "The Effect of Ultraviolet Light Curing on the Material and Fracture Properties of a k-2.5 Low-k Dielectric" Mater. Res. Soc. Symp. Proc. vol. 990 2007 pp. 1-5.*

Khellah, M., et al., "34.2: A 4.2Ghz 0.3mm$^2$ 256kb Dual-$V_{cc}$ SRAM Building Block in 65nm CMOS," IEEE International Solid-State Circuits Conference, Digest of Technical Papers, Feb. 8, 2006, Session 34 / SRAM / 34.2, pp. 624-625, 678.

* cited by examiner

PROCESS FOR IMPROVING THE RELIABILITY OF INTERCONNECT STRUCTURES AND RESULTING STRUCTURE

TECHNICAL FIELD

This invention relates generally to integrated circuits, and more particularly to the structure and formation methods of interconnect structures in integrated circuits.

BACKGROUND

As advances in processing technology allow for an increasing number of devices to be fabricated on a single integrated circuit (IC), the surface area or size of each individual device on the IC is scaled down or reduced. Conductive lines or interconnect structures that electrically couple such individual devices are also scaled. However, the same scaling factor applied to line width and line-to-line spacing is not generally applied to interconnect line thickness due to the need to maintain minimum current-carrying capacity. Thus, interconnect lines are often thicker than those for which the scaling factor employed for the line width would predict.

Adjacent interconnect lines form parasitic capacitors. The plate area of each plate of the capacitor formed is the product of the length of the line and its thickness over that length. The capacitances of such capacitors are directly proportional to the area of the capacitor plates and the dielectric constant of the dielectric material disposed between the plates and inversely proportional to the distance between the capacitor plates (line-to-line spacing). Thus, as IC's are scaled down in size, the line-to-line spacing decreases. In addition, the number of lines that are needed to interconnect the increased number of devices also increases, resulting in an increase in the line-to-line capacitance. In some high-speed circuits, this interconnect capacitance can be the limiting factor in the speed of the integrated circuit. Thus it is desirable to reduce the interconnect capacitance.

A significant factor in the value of the interconnect capacitance is the dielectric constant of the materials that surround the interconnect lines, as capacitance is directly proportional to the dielectric constant. Therefore, to reduce the capacitance of the interconnect structure, low dielectric constant (k) materials have been increasingly used. However, it has been found that use of such low dielectric constant (low-k) materials is often problematic.

FIG. 1 illustrates a typical interconnect structure. Metal lines 2 are formed in a low-k dielectric layer 4. A cap layer 6 is formed on the low-k dielectric layer 4 and metal lines 2. It has been found that the interface 10 between metal lines 2 and cap layer 6 is electrically weak. Due to the different voltages in the metal lines, leakage current may exist between the metal lines, which causes electrical migration. Copper inside the metal lines 2 therefore diffuses along the interface 10. As a result, the reliability of the integrated circuit is adversely affected, and the mean time to failure (MTTF) is reduced.

What is needed in the art, therefore, is an interconnect structure that may incorporate low-k dielectric materials to take advantage of the benefits associated with reduced capacitance while at the same time overcoming the deficiencies of the prior art.

SUMMARY OF THE INVENTION

In accordance with one aspect of the present invention, a method for forming an integrated circuit interconnect structure includes providing a substrate, forming a dielectric layer overlying the substrate, performing a first shrinking process wherein the dielectric layer shrinks and has a first shrinkage rate, forming a conductive feature in the dielectric layer after the step of performing the first shrinking process, and performing a second shrinking process after the step of forming the conductive feature, wherein the dielectric layer substantially shrinks and has a second shrinkage rate.

In accordance with another aspect of the present invention, a method for forming an integrated circuit interconnect structure includes providing a substrate, forming a dielectric layer having a k value of less than about 3.5 overlying the substrate, forming an opening in the dielectric layer, filling the opening with a metallic material to form a metallic feature, and performing a treatment to the dielectric layer to cause a shrinkage in the dielectric layer after the step of filling the opening, wherein a top surface of the dielectric layer between the metallic feature and a neighboring metallic feature has a curve with an edge portion higher than a central portion.

In accordance with yet another aspect of the present invention, an integrated circuit structure includes a substrate, a dielectric layer overlying the substrate, a first conductor and a second conductor in the dielectric layer, and an etching buffer layer on the dielectric layer and over at least portions of the first and the second conductors. A portion of an interface between the dielectric layer and the etching buffer layer has a curve with an edge portion higher than a central portion, wherein a height of the curve to a horizontal length of the curve is greater than about 0.14.

In accordance with yet another aspect of the present invention, an integrated circuit structure includes a substrate, a dielectric layer overlying the substrate, a first conductor and a second conductor in the dielectric layer, an etching buffer layer on the dielectric layer and over at least portions of the first and the second conductors, and a curve in an interface between the dielectric layer and the etching buffer layer, wherein a length of the interface to a spacing between the first conductor and the second conductor has a ratio of greater than about 1.3.

The advantageous features of the present invention include an improved diffusion barrier layer due to smaller porosity when the diffusion barrier layer is formed and reduced electrical migration due to a prolonged electrical migration path.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The intermediate stages of manufacturing a preferred embodiment of the present invention are illustrated in FIGS.

2 through 8B. Throughout the various views and illustrative embodiments of the present invention, like reference numbers are used to designate like elements.

Figure 1:
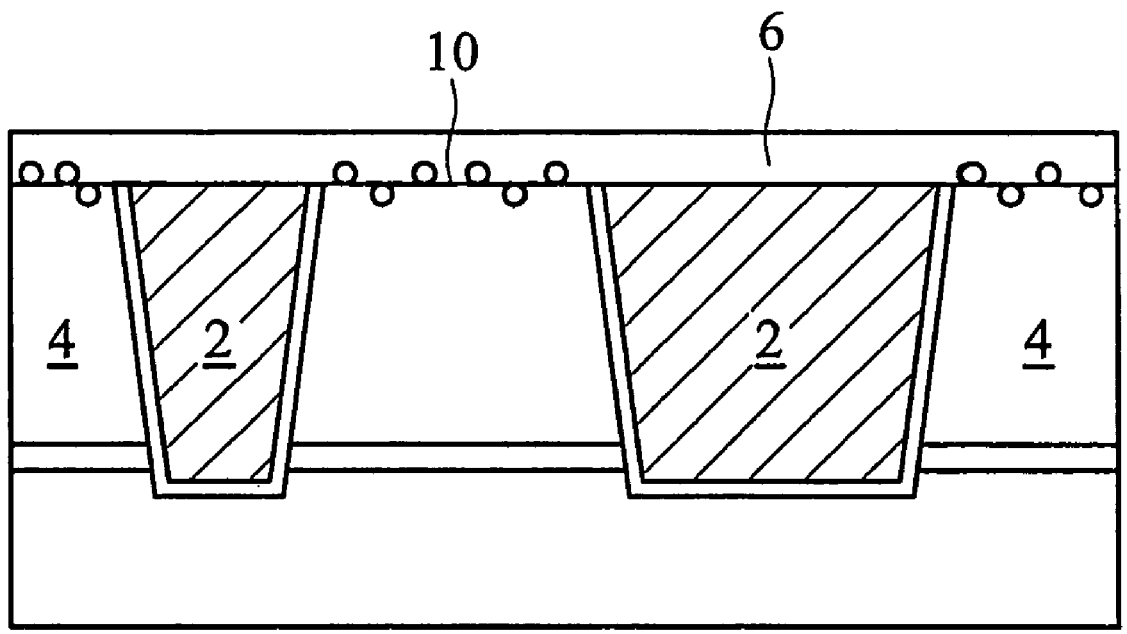
FIG. 1 illustrates a prior art interconnect structure with a low-k dielectric layer interfacing a cap layer.
Figure 2:
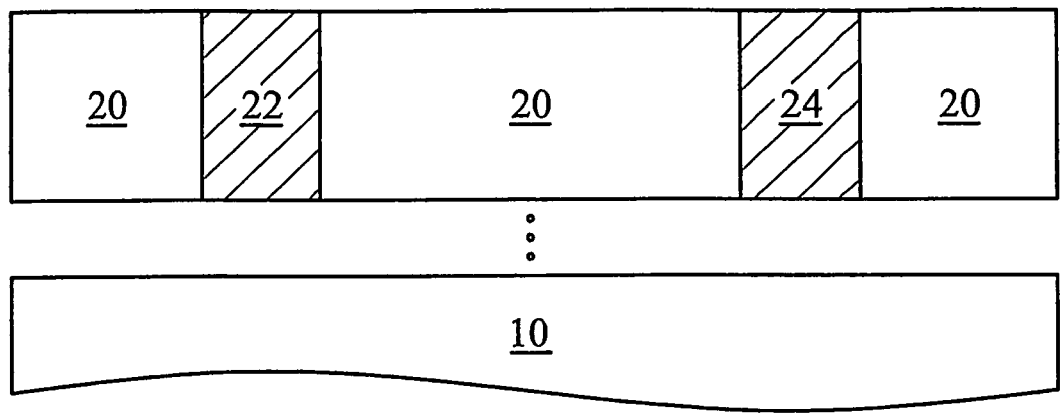
FIGS. 2 through 8B are cross-sectional views of intermediate stages in the manufacture of a preferred embodiment.

FIG. 2 illustrates a substrate 10, a dielectric layer 20 over substrate 10 and two conductive features 22 and 24 formed in dielectric layer 20. Conductive features 22 and 24 are preferably metal lines comprising copper, tungsten, aluminum, silver, gold, and the like. They can also be formed of other conductive materials such as doped polysilicon. Conductive features 22 and 24 may be connected to other underlying features (not shown), such as metal lines, vias, contact plugs, or silicide regions of MOS devices. Dielectric layer 20 may be an inter-layer dielectric (ILD) layer or an inter-metal dielectric (IMD) layer. For simplicity, substrate 10 will not be shown in subsequent drawings.

Figure 3:
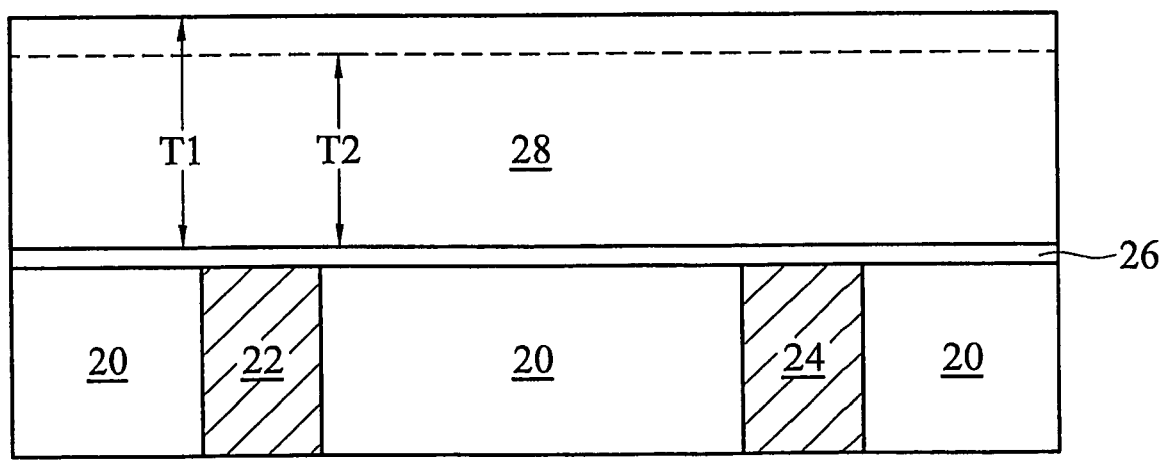

FIG. 3 illustrates the formation of an optional etch stop layer (ESL) 26 on conductive lines 22 and 24 and dielectric layer 20 and a low-k dielectric layer 28 over ESL 26. Preferably, ESL 26 comprises dielectric materials such as carbon-containing materials including silicon oxycarbide (SiOC), silicon carbon nitride (SiCN), silicon oxycarbon nitride (SiOCN) and silicon carbide (SiC), nitrogen-containing materials including silicon nitride (SiN), metal nitride, the like. Low-k dielectric layer 28 preferably has a dielectric constant (k) value of lower than about 3.5, and more preferably lower than about 3.2, or even lower than 2.5. The preferred materials include carbon-containing materials, organosilicate glass, porogen-containing materials, and combinations thereof. Low-k dielectric layer 28 may be deposited using a chemical vapor deposition (CVD) method, preferably plasma enhanced CVD (PECVD), although other commonly used deposition methods such as low pressure CVD (LPCVD), atomic layer chemical vapor deposition (ALCVD), and spin-on can also be used. If formed using 65 nm technology, the preferred thickness T1 of low-k dielectric layer 28 is between about 800 Å and about 3000 Å, and more preferably about 1850 Å. However, one skilled in the art will realize that the dimensions of features in the integrated circuit will be reduced when smaller-scale technologies are employed.

A first treatment, which preferably includes a curing process, is then performed. The resulting structure has a reduced thickness T2. The curing process can be performed using commonly used curing methods, such as ultraviolet (UV) curing, eBeam curing, thermal curing, and the like, and may be performed in a production tool that is also used for PECVD, atomic layer deposition (ALD), LPCVD, etc.

In an exemplary UV curing process, an ultraviolet radiator tool is utilized. The exemplary process conditions include a temperature of between about 150° C. and about 500° C., a curing power of between about 250 W and about 950 W, and a curing time of about 120 seconds to about 540 seconds. The curing may be performed in a vacuum environment or in an environment containing radicals in process gases such as hydrogen, nitrogen, helium, argon, and combinations thereof. The wavelength of a UV curing process is preferably less than about 365 nm.

In alternative embodiments, the first treatment includes a thermal curing. In an exemplary embodiment, the thermal curing is performed at a temperature of between about 250° C. and about 500° C. and for a duration of between about 20 seconds and about 300 seconds, depending on the porogen concentration in low-k dielectric layer 28.

The first treatment has the function of driving porogen out of low-k dielectric layer 28 and improving its mechanical property. Pores will then be generated in low-k dielectric layer 28. In the preferred embodiment, after the treatment, thickness T2 of the low-k dielectric layer 28 is reduced by about 5 percent to about 20 percent, compared to thickness T1 before the curing process. The reduction rate in the thickness is also referred to as a shrinkage rate. The film stress of low-k dielectric layer 28 might be different from the original film stress after the first treatment.

Although porosity is a desired feature for producing low-k dielectric materials, high porosity causes difficulty in the subsequent damascene process. When openings are formed in low-k dielectric layer 28, pores cause a rough surface in the opening and adversely affect the evenness of the barrier layer, hence the reliability of the interconnect structure. Therefore, in the preferred embodiment, the process is controlled so that porosity is not fully developed by the first treatment.

Figure 4:
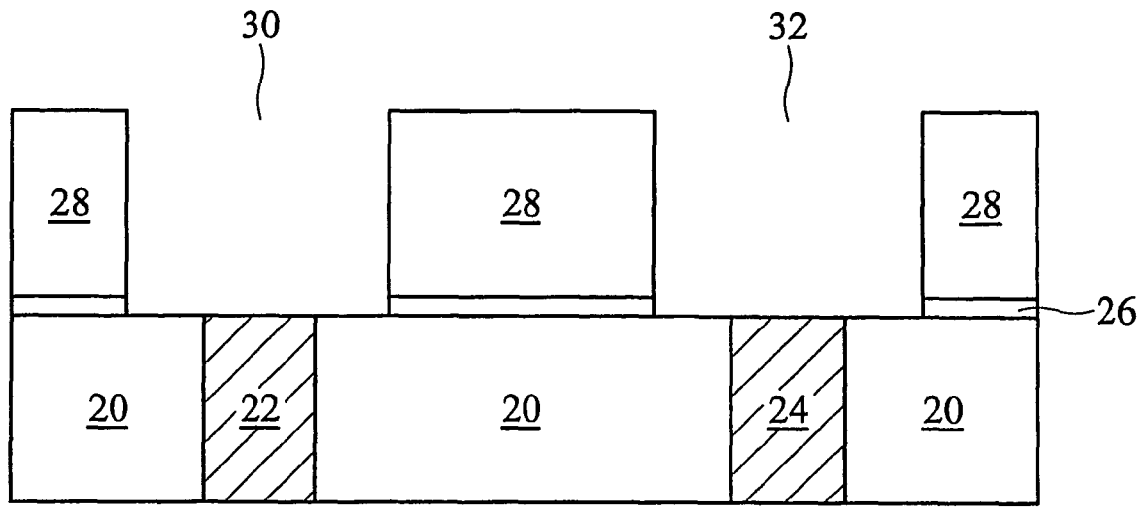

FIG. 4 illustrates the formation of via openings 30 and 32. As is known in the art, to form the openings, a photo resist (not shown) may be formed and patterned over low-k dielectric layer 28 to mask the regions to be protected. Via openings 30 and 32 are then formed, preferably by etching low-k dielectric layer 28. The etching is preferably stopped at ESL 26, which protects the underlying conductive features 22 and 24 from being over-etched. Next, the exposed portion of ESL 26 is etched. Because ESL 26 is relatively thin compared to low-k dielectric layer 28, process control and end-point detection are much more closely controlled, thus limiting the likelihood of over-etching the underlying lower-layer conductive features 22 and 24.

Figure 5:
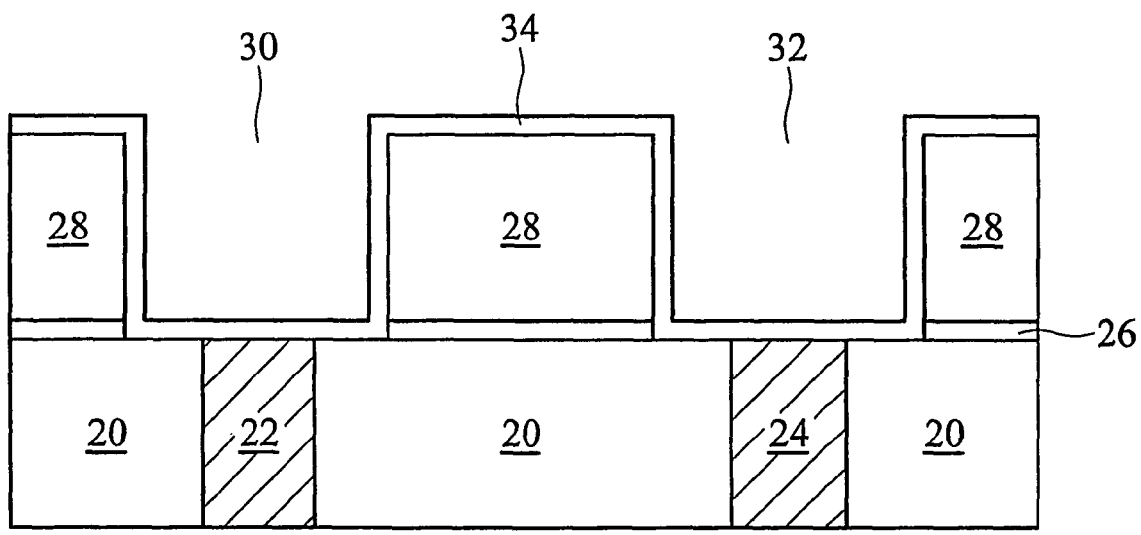

In FIG. 5, a diffusion barrier layer 34 is formed. Diffusion barrier layer 34 prevents the subsequently filled materials, particularly copper, from diffusing into low-k dielectric layer 28. Diffusion barrier layer 34 also prevents impurities in low-k dielectric layer 28 from diffusing into the filled materials. In the preferred embodiment, diffusion barrier layer 34 comprises titanium, titanium nitride, tantalum, tantalum nitride, tungsten nitride, and combinations thereof. The preferred formation methods include physical vapor deposition (PVD), CVD, ALD, and the like. In other embodiments, diffusion barrier layer 34 comprises carbon-containing materials including silicon oxycarbide (SiOC), silicon carbon nitride (SiCN), silicon oxycarbon nitride (SiOCN) and silicon carbide (SiC), and nitrogen-containing materials including silicon nitride (SiN), and may be formed using CVD, ALD, and the like. In these embodiments, an opening (not shown) may be formed in the bottom portion of diffusion barrier layer 34, exposing the underlying conductive features 22 and 24.

Figure 6:
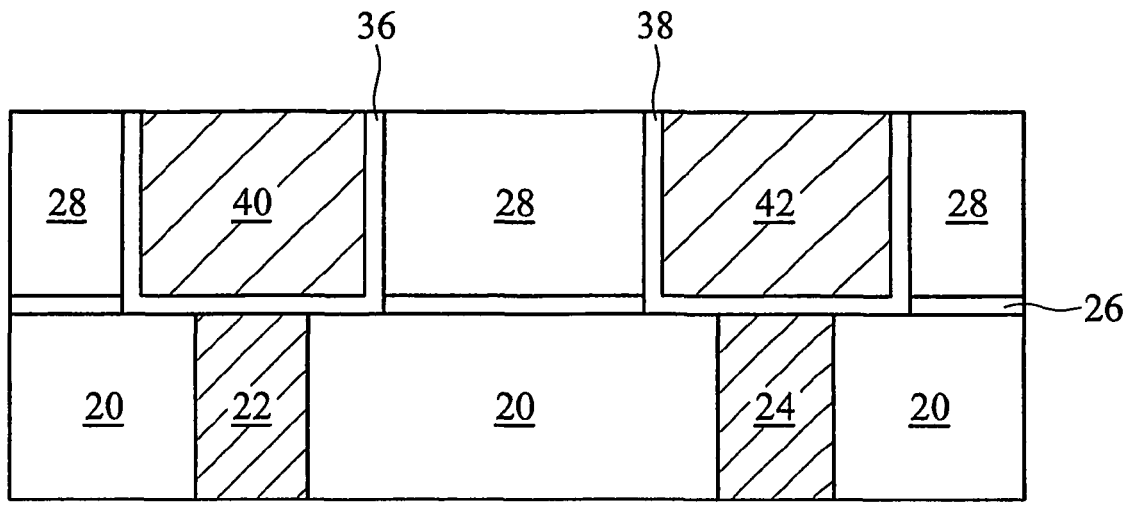

Referring to FIG. 6, the openings 30 and 32 are filled. In the preferred embodiment, the filling material includes metals such as copper, aluminum, tungsten, silver, gold, and/or other well-known alternatives. A chemical mechanical polish is then performed to remove excess materials. The remaining filling material forms metal features 40 and 42, and the remaining portion of diffusion barrier layer 34 forms diffusion barrier layers 36 and 38, respectively.

Figure 7:
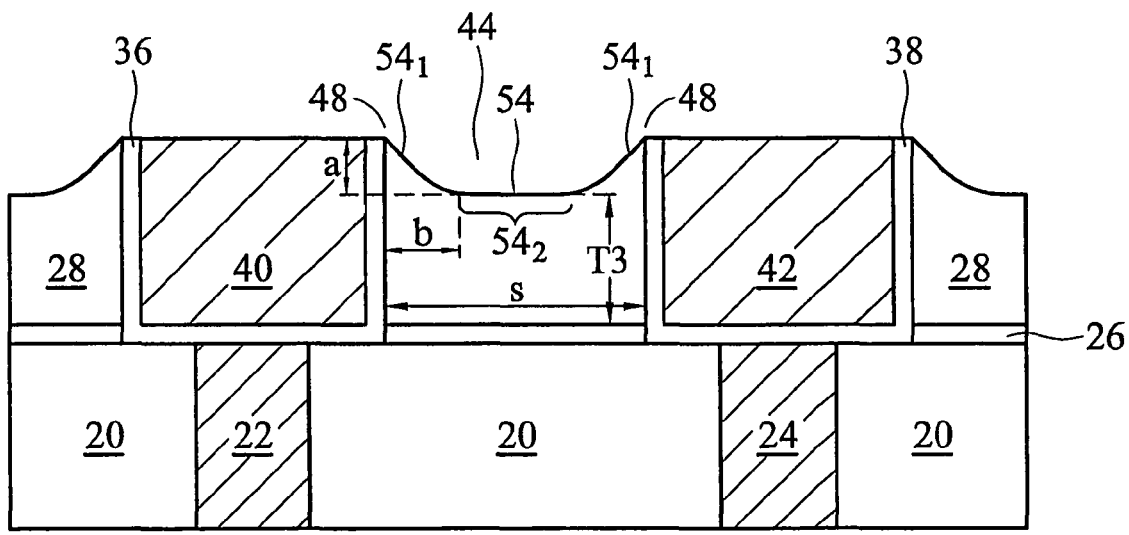

A second treatment is then performed. Preferably, the second treatment includes a curing process, such as UV curing, eBeam curing, thermal curing, or other known alternative curing methods. More preferably, the second treatment is preformed using a UV radiation with a wavelength of less than about 365 nm. Due to the second treatment, the porosity in low-k dielectric layer 28 is further developed, and low-k dielectric layer 28 further shrinks, resulting in a structure as shown in FIG. 7. A recess 44 is formed between metal features 40 and 42. The recess 44 has a central portion $54_2$ substantially lower than edge points 48 adjacent barrier layers 36 and 38. Preferably, the second treatment causes low-k dielectric layer 28 to have a shrinkage rate of between about 5 percent and about 20 percent.

The second treatment may further include an etching process to deepen recess 44. The etching process is preferably highly selective and only low-k dielectric layer 28 is etched. Both dry etching (for example, plasma etching) and wet etching may be used. In an exemplary embodiment, a wet etching is performed using HF solvent. In other embodiments, the curing process can be combined with etching to form recess 44 with a desired depth.

It is appreciated that since different materials may be used for forming low-k dielectric layer 28, the total shrinkage rate (including the first treatment and the second treatment) varies. The processes of the first and the second treatments are preferably controlled so that substantial shrinkage occurs in both treatments and a final stress of the treated low-k dielectric layer 28 of less than about 13 GPa, or even less than 10 GPa, would be achieved. The film stress of the low-k dielectric layer 28 after the second treatment might also be different from the film stress after the first treatment. Preferably, the shrinkage rate caused by the first curing process is between about 5 percent and about 20 percent of the overall shrinkage rate. This can be achieved by controlling curing process conditions such as curing power, curing time, and/or curing temperature.

In yet another embodiment, the second treatment to low-k dielectric layer 28 might be performed merely without the first treatment after the two conductive features 22 and 24 are formed in dielectric layer 20. A final stress of the treated low-k dielectric layer 28 of less than about 13 Gpa, or even less than 10 GPa, would be achieved. The shrinkage rate caused by the curing process is between about 5 percent and about 20 percent. This can be achieved by controlling curing process conditions such as curing power, curing time, and/or curing temperature.

Figure 8A:
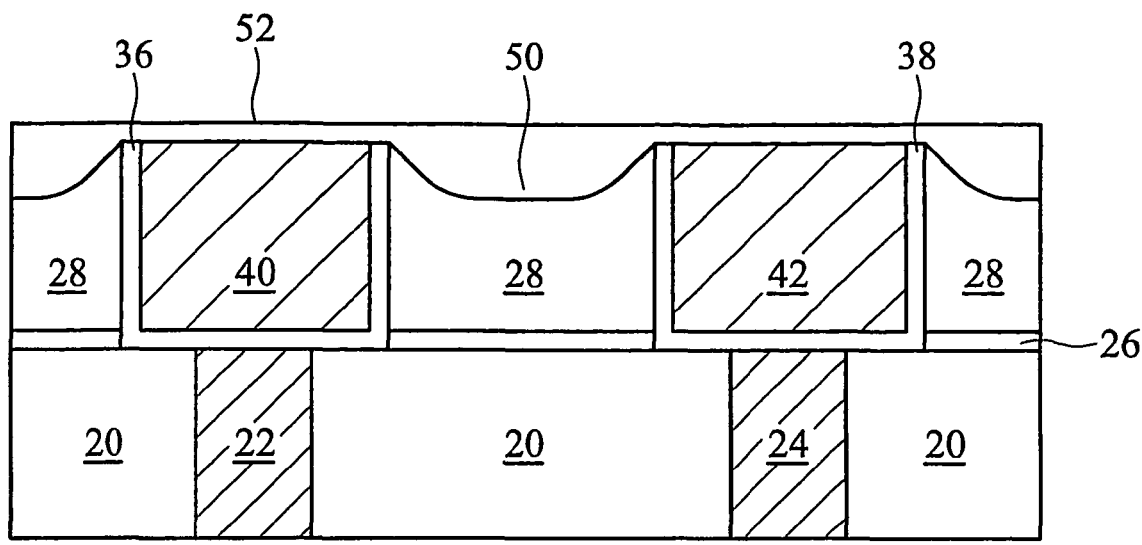
Figure 8B:
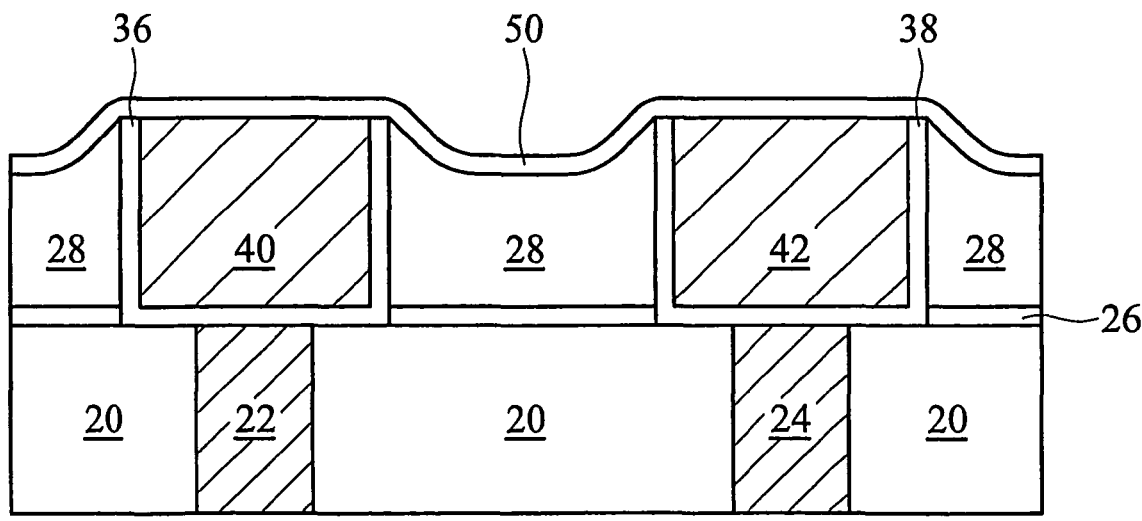

Referring to FIG. 8A, an additional dielectric layer 50, often referred to as a cap layer 50 or an etching buffer layer 50, is formed over low-k dielectric layer 28 and conductive features 40 and 42. In the preferred embodiment, dielectric layer 50 comprises carbon-containing materials including silicon oxycarbide (SiOC), silicon carbon nitride (SiCN), silicon oxycarbon nitride (SiOCN) and silicon carbide (SiC), nitrogen-containing materials including silicon nitride (SiN), metal nitride, and combinations thereof. The preferred formation methods include PECVD, ALD, low temperature CVD (LTCVD), LPCVD, and the like. In one embodiment, dielectric layer 50 fills the recess 44 and has a leveled surface 52, which is higher than top surfaces of metal features 40 and 42. In alternative embodiments, dielectric layer 50 has a thickness of less than the depth of recess 44, and the top surface of dielectric layer 50 follows the contour of the top surface of low-k dielectric layer 28 and conductive features 40 and 42, as shown in FIG. 8B. After the formation of dielectric layer 50, more low-k dielectric layers (not shown) may be formed on dielectric layer 50, and more interconnect structures are formed in the low-k dielectric layers.

Although in the previously discussed embodiment, a single damascene process is used as an example to explain the concept of the present invention, one skilled in the art will realize that the method taught is readily available for use in dual damascene processes.

Referring back to FIG. 7, recess 44 has a curved profile with a curved interface 54 between low-k dielectric layer 28 and a subsequently formed layer on low-k dielectric layer 28. Interface 54 includes curved portions $54_1$ and possibly a relatively flat portion $54_2$. The surfaces of low-k dielectric layer 28 close to diffusion barrier layers 36 and 38 are higher than the surface near the flat portion $54_2$. Assuming a and b are used to represent the height and horizontal length from the highest point of the top surface of low-k dielectric layer 28 to the edge of curved portion $54_1$, respectively, a parameter $\gamma$, which equals a/b, may be used to indicate the curvature of recess 44. The height of a is greater about 150 Å, and in the preferred embodiment, $\gamma$ is preferably greater than about 0.14, and more preferably about 0.2 to about 1.0.

It should be appreciated that even when the same process conditions are used, different spacing S between metal features 40 and 42 will cause the $\gamma$ values to be different. Typically, with an increase in the line spacing S, $\gamma$ will decrease. In the preferred embodiment, a $\gamma$ value of greater than about 0.14 is preferred when line spacing S is less than about 0.3 µm and a horizontal length b is less than about 1500 Å.

From FIG. 7, it is observed that a distance between metal feature 40 and 42 along the interface of low-k dielectric layer 28 and dielectric layer 50 is greater than the spacing S due to the curvature of the recess 44. Since significant electrical migration occurs along the interface, such an increase in the electrical migration path will reduce the electrical migration, and thus the mean time to failure (MTTF) is increased.

The curved interface 54 has a length along the curve and a spacing S between metal features 40 and 42. Preferably the length and the spacing have a ratio substantially greater than 1. More preferably, the ratio is greater than about 1.3. Even more preferably, the ratio is greater than about 1.5. Although, in the preferred embodiment, the length of the interface is increased by recessing low-k dielectric layer 28, low-k dielectric layer 28 may have any other shape and curved profile that results in the increased interface length.

The preferred embodiment of the present invention includes two treatments (curing processes). Each of the treatments makes low-k dielectric layer 28 more porous. The first treatment does not fully develop porosity in low-k dielectric layer 28. As a result, when a damascene process is performed, low-k dielectric layer 28 has less porosity, and thus the likelihood of having pores of great size right at the edge of the openings 30 and 32 (refer to FIG. 3) is reduced. This results in the formation of better diffusion barrier layers 36 and 38. Additionally, the second treatment increases the electrical migration distance, and thus the reliability of the integrated circuits is improved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming an interconnect structure of an integrated circuit, the method comprising:
   providing a substrate;
   forming a dielectric layer having a k value of less than 3.5 overlying the substrate;
   forming an opening in the dielectric layer;
   filling the opening with a metallic material to form a metallic feature;
   performing a treatment to the dielectric layer to cause a shrinkage in the dielectric layer after the step of filling the opening, wherein a top surface of the dielectric layer between the metallic feature and a neighboring metallic feature has a curve with an edge portion higher than a central portion; and
   after the step of performing the treatment, forming a cap dielectric layer over and contacting the dielectric layer.

2. The method of claim 1 further comprising performing an additional treatment to the dielectric layer before the step of filling the opening.

3. The method of claim 2, wherein the treatment and the additional treatment comprise a UV curing at a wavelength of less than 365 nm.

4. The method of claim 1, wherein a ratio of a height of the curve to a horizontal length of the curve is greater than 0.14 when a spacing between the metallic feature and the neighboring metallic feature is less than 0.3 μm and the horizontal length is less than 1500 Å.

5. The method of claim 4, wherein the ratio is greater than 0.2.

6. The method of claim 1 further comprising a selective removal of top portions of the dielectric layer after the step of forming the metallic feature.

7. The method of claim 1, wherein the step of performing the treatment and the step of performing the additional treatment are both performed when the top surface of the dielectric layer is exposed.

8. The method of claim 2, wherein the step of performing the treatment and the step of performing the additional treatment are both performed when no additional layer is over and contacting the top surface of the dielectric layer.

* * * * *

UNITED STATES PATENT AND TRADEMARK OFFICE
CERTIFICATE OF CORRECTION

| | | |
|---|---|---|
| PATENT NO. | : 7,816,256 B2 | Page 1 of 1 |
| APPLICATION NO. | : 11/487741 | |
| DATED | : October 19, 2010 | |
| INVENTOR(S) | : Chen et al. | |

It is certified that error appears in the above-identified patent and that said Letters Patent is hereby corrected as shown below:

In Col. 8, line 14, claim 7, delete "claim 1" and insert --claim 2--.

Signed and Sealed this

Seventh Day of December, 2010

David J. Kappos
*Director of the United States Patent and Trademark Office*